US011038033B2

(12) United States Patent
Villavelez et al.

(10) Patent No.: US 11,038,033 B2
(45) Date of Patent: Jun. 15, 2021

(54) INTEGRATED CIRCUITS

(71) Applicant: HEWLETT-PACKARD DEVELOPMENT COMPANY, L.P., Houston, TX (US)

(72) Inventors: Reynaldo V Villavelez, Corvallis, OR (US); Ning Ge, Palo Alto, CA (US); Mun Hooi Yaow, Singapore (SG); Erik D Ness, Vancouver, WA (US); David B Novak, Philomath, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 186 days.

(21) Appl. No.: 15/306,740

(22) PCT Filed: Apr. 30, 2014

(86) PCT No.: PCT/US2014/036057
§ 371 (c)(1),
(2) Date: Oct. 25, 2016

(87) PCT Pub. No.: WO2015/167498
PCT Pub. Date: Nov. 5, 2015

(65) Prior Publication Data
US 2017/0053993 A1 Feb. 23, 2017

(51) Int. Cl.
*H01L 29/43* (2006.01)
*H01L 29/423* (2006.01)
*H01L 21/28* (2006.01)
*H01L 49/02* (2006.01)

(52) U.S. Cl.
CPC .. *H01L 29/42324* (2013.01); *H01L 29/40114* (2019.08); *H01L 29/42332* (2013.01); *H01L 28/60* (2013.01)

(58) Field of Classification Search
CPC ......... H01L 27/11517; H01L 27/11519; H01L 27/11521; H01L 27/11524; H01L 28/40; H01L 28/60; H01L 28/65; H01L 28/75; H01L 28/82; H01L 28/84; H01L 28/86; H01L 28/88; H01L 28/87; H01L 29/42324; H01L 29/42332; H01L 29/40114
See application file for complete search history.

(56) References Cited

U.S. PATENT DOCUMENTS

| 6,093,607 | A | 7/2000 | Hsieh et al. |
| 6,265,268 | B1 | 7/2001 | Halliyal et al. |
| 6,842,327 | B1 | 1/2005 | Diorio et al. |

(Continued)

FOREIGN PATENT DOCUMENTS

| CN | 1708861 A | 12/2005 |
| KR | 10-2014-0047818 A | 4/2016 |

(Continued)

*Primary Examiner* — Sue A Purvis
*Assistant Examiner* — Scott Stowe
(74) *Attorney, Agent, or Firm* — Crawford Maunu PLLC

(57) ABSTRACT

The present subject matter relates to an integrated circuit. The integrated circuit includes a first metal layer and a second metal layer capacitively coupled to the first metal layer through a dielectric layer. Further, the second metal layer includes an electron leakage path to provide for leakage of charge from the second metal layer in a predetermined leak time period.

20 Claims, 4 Drawing Sheets

(56) References Cited

U.S. PATENT DOCUMENTS

| | | |
|---|---|---|
| 2006/0281247 A1* | 12/2006 | De Zaldivar ..... H01L 21/28273 |
| | | 438/238 |
| 2007/0097745 A1 | 5/2007 | Benjamin |
| 2008/0112225 A1 | 5/2008 | Benjamin |
| 2009/0283812 A1 | 11/2009 | Asami |
| 2012/0243337 A1 | 9/2012 | Lee et al. |

FOREIGN PATENT DOCUMENTS

| | | |
|---|---|---|
| TW | 523815 | 3/2003 |
| TW | 200937428 A | 9/2009 |
| WO | WO-2008089227 | 7/2008 |

* cited by examiner

INTEGRATED CIRCUITS

BACKGROUND

Integrated circuits generally include multiple electronic components, such as resistors, capacitors, diodes, and transistors, fabricated as a single unit. Owing to lower cost, smaller size, and enhanced performance as compared to discrete circuits, integrated circuits have become virtually ubiquitous in electronic devices. Many electronic devices, such as consumer electronics, automobiles, computing systems, and other devices associated with the computing systems, include integrated circuits to perform a variety of tasks. Accordingly, various integrated circuits may have varying configurations depending on the end tasks to be performed.

BRIEF DESCRIPTION OF FIGURES

The detailed description is provided with reference to the accompanying figures. In the figures, the left-most digit(s) of a reference number identifies the figure in which the reference number first appears. The same numbers are used throughout the figures to reference like features and components.

DETAILED DESCRIPTION

Figure 1:
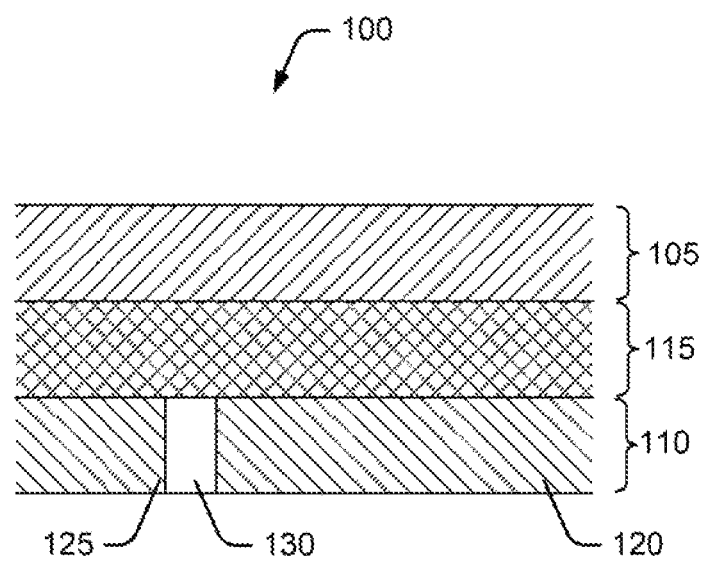
FIG. 1 illustrates a cross-sectional view of an integrated circuit, according to an example of the present subject matter.

According to an example of the present subject matter, an integrated circuit, such as a memory chip is described. The integrated circuit, such as volatile and non-volatile memory chips, may be used in, for example, consumer electronics, computing devices, and other electronic devices. The integrated circuit may include a first metal layer and a second metal layer capacitively coupled to the first metal layer through a dielectric layer. In an example, the first metal layer may be associated with a control gate and the second metal layer may be associated with a floating gate. The second metal layer may include a bulk electron portion and a portion adjacent to the bulk electron portion, also referred to as, adjacent portion.

In an example, the bulk electron portion is formed such that a positive capacitance coupling ratio is achieved. The capacitance coupling ratio may be a ratio of a capacitance between the control gate and the floating gate to a capacitance between the floating gate and a semiconductor substrate layer having a source junction and drain junction. The bulk electron portion may be separated from the adjacent portion by a predetermined distance.

The bulk electron portion may include free electrons when a charge is applied to a corresponding bit in the integrated circuit. In one example, each bit of the integrated circuit may have a corresponding first metal layer, the second metal layer, and the semiconductor substrate layer. Accordingly, the bit may be charged when charge is applied to the drain junction associated with the bit. Upon charging, the stored electrons from the bulk electron portion may leak to the adjacent portion through an electron leakage path in a predetermined leak time period.

The electron leakage path may be provided between the bulk electron portion and the adjacent portion. In an example, the electron leakage path may be provided by way of one or more metal stringers formed between the bulk electron portion and the adjacent portion in the second metal layer. The cross-section of the electron leakage path, in one example, may determine a duration of the predetermined leak time period. Further, the leakage of the charge, electrons, may change a state of a corresponding bit of the integrated circuit from a programmed state to an unprogrammed state in the predetermined leak time period. The predetermined leak time period may be, for example, of the order of seconds, minutes, or hours, as against traditional non-volatile memory chips, where the applied charge may be stored for a substantial long period of time, typically in the order of years.

Accordingly, a bit which may otherwise store the charge for longer durations, may lose the charge in the predetermined leak time period. Thus, in an example, a memory chip, such as a volatile memory chip and a non-volatile memory chip, may have one or more bits which may change state in a corresponding predetermined leak time period. The described integrated circuits may be used for a variety of applications, for instance, to check quality of circuits on consumables, such as print cartridges, which may include ink cartridges and titration print heads. Further, in one example, the traditional systems and methods may be used for testing and programming the present integrated circuit, thereby making it convenient to use the present integrated circuit in various devices without incurring extra costs.

The above discussed integrated circuits are further described in the figures and associated description below. It should be noted that the description and figures merely illustrate the principles of the present subject matter. It will thus be appreciated that various arrangements that embody the principles of the present subject matter, although not explicitly described or shown herein, can be devised from the description and are included within its scope.

FIG. 1 illustrates a cross-sectional view of an integrated circuit 100, according to an embodiment of the present subject matter. In an example, the integrated circuit 100 may be a non-volatile memory chip, such as an Electrically Programmable Read Only Memory (EPROM) chip. In another example, the integrated circuit may include a plurality of programmable bits. As illustrated, the integrated circuit 100 may include a first metal layer 105 capacitively coupled to a second metal layer 110 through a dielectric layer 115. For the purpose of explanation, while describing the integrated circuit from top down, the metal layer encountered first is referred to as the first metal layer 105 and the subsequent metal layer is referred to as the second metal layer 110.

In an example, the second metal layer 110 may include a bulk electron portion 120 and another portion, which is adjacent to the bulk electron portion 120, also referred to as, an adjacent portion 125. The bulk electron portion 120 and the adjacent portion 125 may be separated by a distance, corresponding to an intermediate portion 130. The intermediate portion 130 may include a metal connect as an electron leakage path. The metal connect may be provided by way of one or more metal stringers (not shown in FIG. 1) between the bulk electron portion 120 and the adjacent portion 125. Thus, the bulk electron portion 120 may be coupled to the adjacent portion 125 through the metal connect, i.e., the electron leakage path. The electron leakage path may provide for leakage of electrons from the bulk electron portion 120 to the adjacent portion 125. In an example, the electron leakage path may be provided as one or more metal stringers in the intermediate portion 130. The electron leakage path and the metal stringers are discussed in detail with reference to FIGS. 2a-2c and FIG. 3.

Further, leakage of the electrons through the electron leakage path may be achieved in a predetermined leak time period. This in turn may result in change in a state of a bit of the integrated circuit 100. In one case, an electron leakage path may be provided for each of a plurality of bits in the integrated circuit 100. In said case, the second metal layer 110 corresponding to each such bit may include the bulk electron portion 120 coupled to the adjacent portion 125 by a metal connect to provide for leakage of free electrons in a corresponding predetermined leak time period.

Figure 2A:
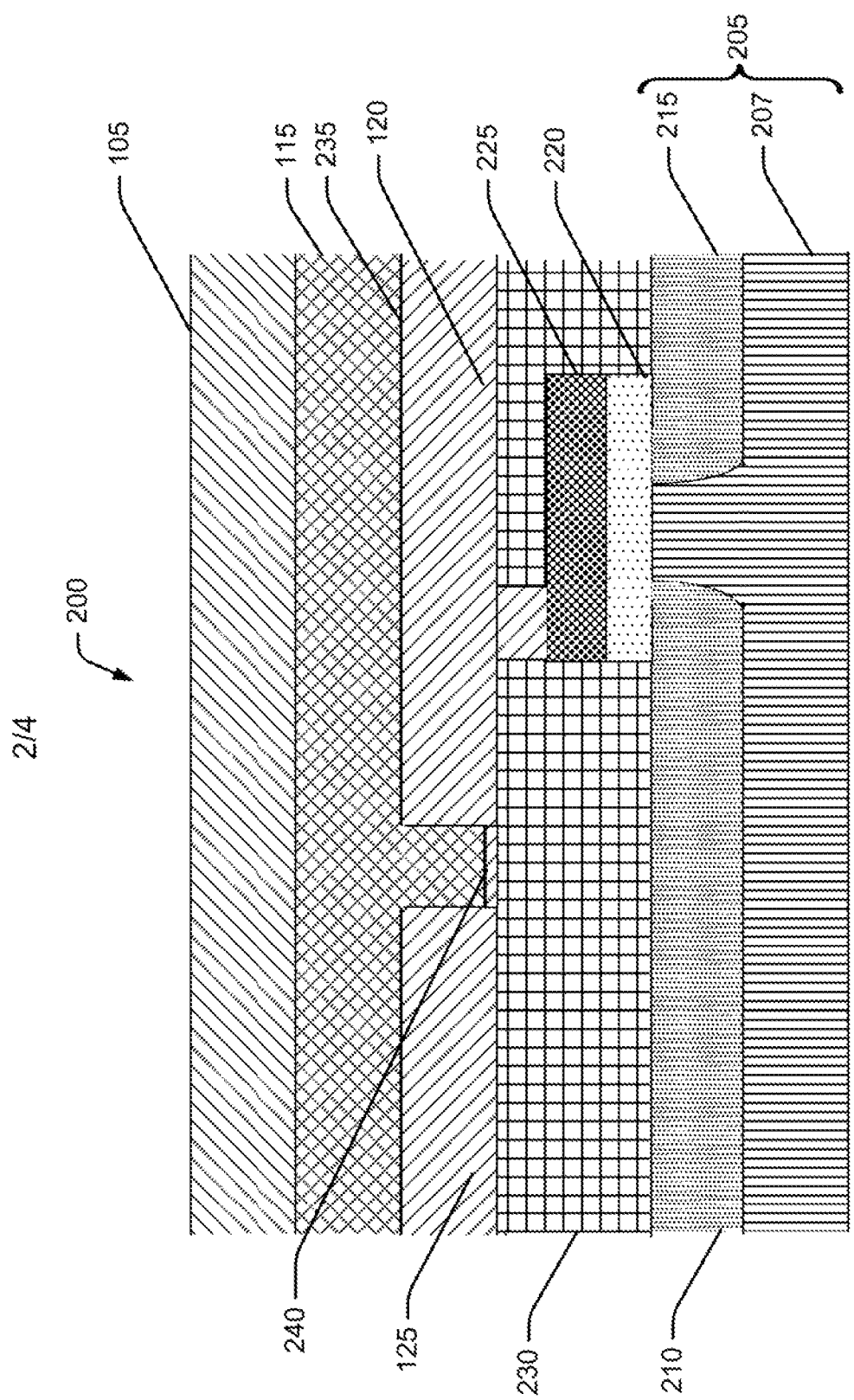
FIG. 2a illustrates a cross-sectional view depicting various layers of the integrated circuit, according to an example of the present subject matter.

FIG. 2a illustrates a cross-sectional view showing various layers corresponding to a bit in an integrated circuit 200, according to an example of the present subject matter. The following description has been explained with reference to an EPROM chip, however it will be appreciated that the principles discussed herein may be extended to other integrated circuits as well, albeit with a few variations. In an example, the integrated circuit 200 includes a semiconductor substrate layer 205 having n-doped regions and a p-doped region 207. The n-doped regions may form a source junction 210 and a drain junction 215. Further, a portion of the p-doped region 207 may be provided between the drain junction 215 and the source junction 210. The semiconductor substrate layer 205 may comprise, for instance, silicon substrate. Further, in one example, the semiconductor substrate layer 205 may have a thickness of about 675 microns, and the source junction 210 and the drain junction 215 may have a thickness in a range of about 1-1.5 microns.

Atop the semiconductor substrate layer 205, an oxide layer 220 may be provided, which in turn may be followed by a polygate layer 225. The oxide layer 220 may include, for example, silicon dioxide and may have thickness of about 700 angstroms (A) in one example. Further, the polygate layer 225 may have a thickness of about 3600 A in one example. The oxide layer 220 may capacitively couple the polygate layer 225 to the semiconductor substrate layer 205. Over the polygate layer 225, and partially surrounding the polygate layer 225 and the oxide layer 220, a gate-dielectric layer 230 may be provided, which may be followed by a second metal layer 235. The second metal layer 235 may be understood to be an example implementation of the second metal layer 110. The dielectric layer 115 may be provided atop the second metal layer 235 to couple the second metal layer 235 to the first metal layer 105. In one example, the gate-dielectric layer 230 may include borophosphosilicate glass (BPSG)/undoped silicon glass (USG) or phosphosilicate glass (PSG)/reox, and may have a thickness of about 10-12 KA. Further, the dielectric layer 115 may include, for instance. Tetraethyl orthosilicate (TEOS)/silicon nitrogen (SIN) or SIN/silicon carbon (SiC) and may have a thickness of about 4-5 KA in one example.

In an example, the first metal layer 105 may form a control gate of the EPROM chip, and the second metal layer 235 along with the polygate layer 225 may form the floating gate. The second metal layer 235 may include the bulk electron portion 120 and the adjacent portion 125 having the intermediate portion 130 (not marked in FIG. 2a) therebetween. The cross-section of the bulk-portion 120 may be selected such that a positive capacitance coupling ratio is maintained. As described earlier, the capacitance coupling ratio may be understood to be a ratio of a capacitance between the control gate and the floating gate to a capacitance between the floating gate and the semiconductor substrate layer 205. In an example, the second metal layer 235 may include aluminum copper silicon (AlCuSi), tantalum aluminum (TaAl)/aluminum copper (Alcu), and may have a thickness of about 5 KA. Further, the first metal layer 105 may include TaAl/AlCu or Ta/Au, and may have a thickness of about 4-5 KA in one example.

In operation, a high voltage bias on the drain junction 215 may generate energetic electrons, and a positive bias between the drain junction 215 and the control gate may pull some of the generated electrons to the floating gate. As more and more electrons are pulled onto the floating gate, the voltage to cause the floating gate to conduct current increases, and eventually a voltage may become more than, say, an operating voltage of the integrated circuit 200. This causes the floating gate to block current and store the applied charge, i.e., free electrons.

In an example, the free electron may be stored in the bulk electron portion 120. The stored electrons may leak through the electron leakage path, which may be provided for example, by way of a metal stringer 240 disposed between the bulk electron portion 120 and the adjacent portion 125 of the second metal layer 235. In one example, the metal stringer 240 may be formed of the constituents that form the second metal layer 235. The formation of the metal stringer 240 and leakage of electrons are discussed in detail with reference to description of FIG. 2b and FIG. 2c.

Figure 2B:
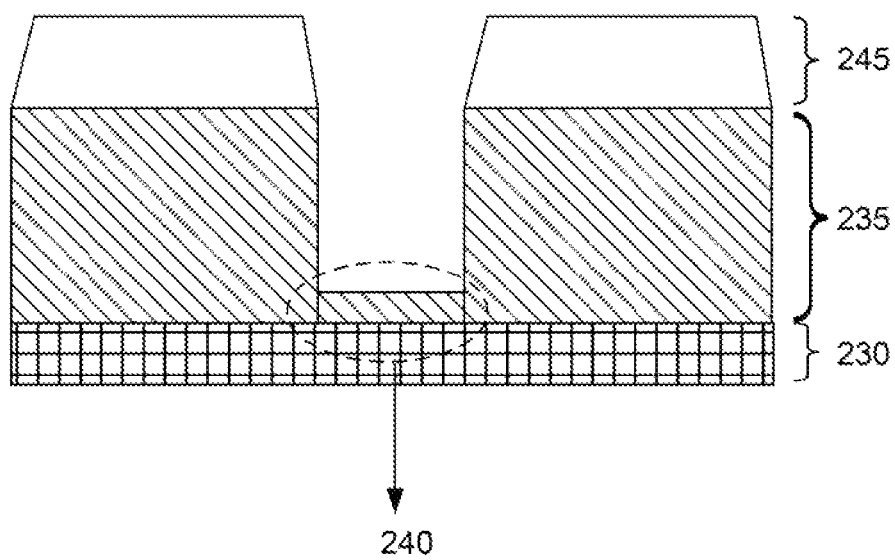
FIGS. 2b and 2c illustrate a second metal layer of the integrated circuit, according to an example of the present subject matter.
Figure 2C:
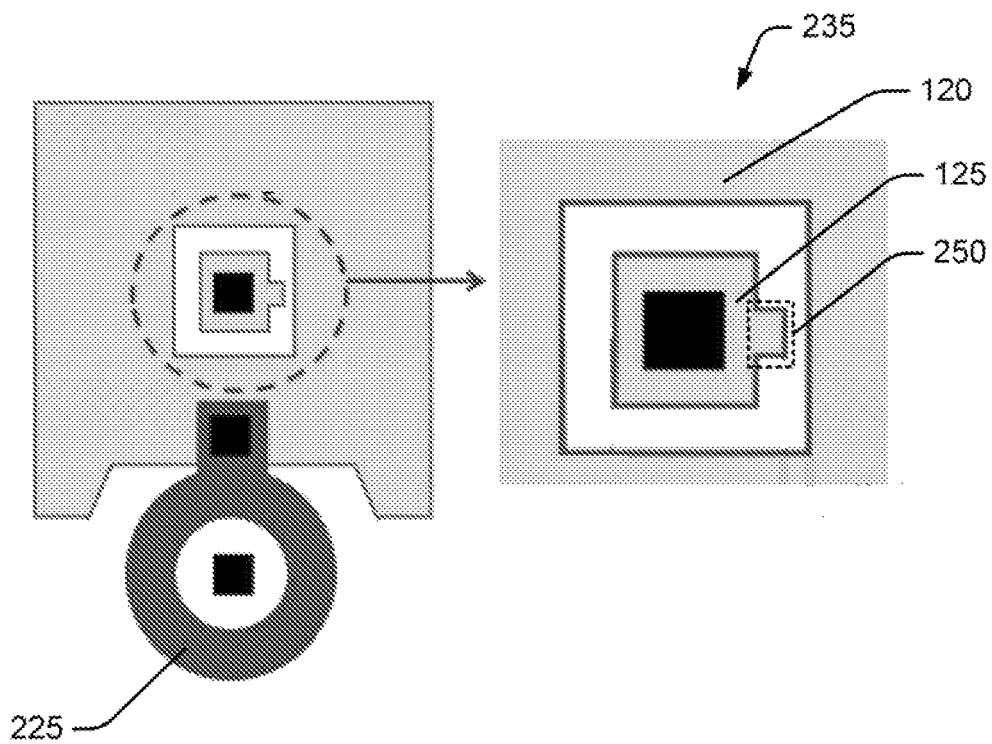

FIG. 2b illustrates the metal stringer 240 formed between the bulk electron portion 120 and the adjacent portion 125 and FIG. 2c schematically illustrates a cross-section of the second metal layer 235 of the integrated circuit 200 before the formation of the metal stringer 240, according to an example of the present subject matter. In an example, the metal stringer 240 may be formed as a residue of an incomplete etching process. Generally, etching is performed for patterning of various layers of an integrated circuit. To pattern the second metal layer 235, a layer of photoresist 245 may be provided on the second metal layer 235. Further, while etching, the regions of photoresist 245 and the underlying second metal layer 235 may be selectively removed to form the bulk electron portion 120, the adjacent portion 125, and the metal stringer 240 therebetween. Accordingly, while etching, the second metal layer 235 may not be completely etched and residue of the second metal after etching may form the metal stringer 240.

For instance, a protrusion 250 as illustrated in FIG. 2c, upon etching may form the metal stringer 240 to couple the adjacent portion 125 to the bulk electron portion 120. Accordingly, on formation of the metal stringer 240, the free electrons stored in the floating gate may leak to the adjacent portion 125, which may act as the electrical ground.

Further, a cross-section of the metal stringer 240 may determine the predetermined leak time period. For example, larger the cross-section of the metal stringer 240, higher may be a rate of decay of electrons through the electron leakage path. Thus, the cross-section of the metal stringer 240 may be so selected during fabrication such that the electrons leak from the bulk electron portion 120 in the predetermined leak time period. In an example, the thickness of the metal stringer 240 may be in the range of angstroms to nanometers and the predetermined leak duration may be at least one second. Also, as the metal stringer 240 is substantially thin, the resistance of the leakage path may be high, which in turn may not affect normal programming of the integrated circuit 200. Further, since the metal stringer 240 may be thin, a finished integrated circuit may appear to be similar to a traditional integrated circuit.

Figure 3:
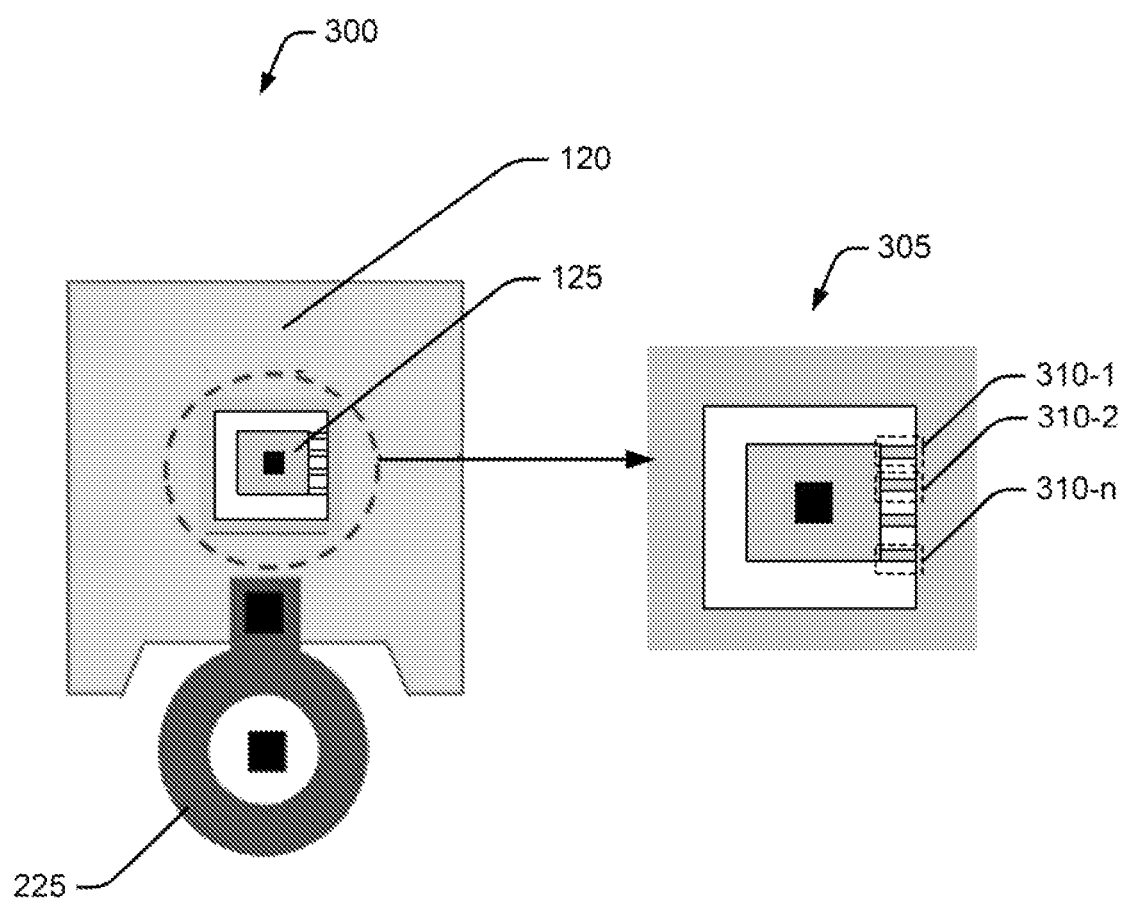
FIG. 3 illustrate a second metal layer of the integrated circuit, according to another example of the present subject matter.

FIG. 3 schematically illustrates a portion of the integrated circuit 300, according to an example of the present subject matter. The integrated circuit 300, similar to the integrated circuit 200, may include the semiconductor substrate layer 205 (not shown in FIG. 3) having the source junction 210 (not shown in FIG. 3) and the drain junction 215 (not shown in FIG. 3), and the source junction 210. Further, the semiconductor substrate layer 205 may also include the p-doped region 207 (not shown in FIG. 3), where a portion of the p-doped region 207 may be provided between the drain junction 215 and the source junction 210. The integrated circuit 300 may also include the oxide layer 220 (not shown in FIG. 3), the polygate layer 225, and the gate-dielectric layer 230 (not shown in FIG. 3).

The gate-dielectric layer 230 may be followed by a second metal layer 305, which may be capacitively coupled to the first metal layer 105 through the dielectric layer 115. The second metal layer 305, which may be understood to be an example implementation of the second metal layer 110, may include the bulk electron portion 120, which includes bulk of electrons, when a corresponding bit of the integrated circuit 300 is programmed. The bulk electron portion 120 may be coupled to the adjacent portion 125 through the electron leakage path. Similar to the integrated circuit 200, in the present example, the bulk electron portion 120 is selected such that a positive capacitance coupling ratio is achieved.

In said example one or more metal to metal connections (not shown in figures) may be provided to connect the bulk electron portion 120 to the adjacent portion 125. The metal connections may be of same material as of the second metal layer 305. The thickness of each of the metal connections may be, for instance, lower than 2 microns. Further, the metal connections may be provided in the intermediate portion 130. In an example, the intermediate portion 130 may extend to the dielectric layer 115 or may extend through the dielectric layer 115 to the first metal layer 105, thereby exposing the metal connections 110 provided between the bulk electron portion 120 and the adjacent portion 125.

During etching, the bulk electron portion 120 and the adjacent portion 125 may be masked, while the intermediate portion 130 may not be masked thereby exposing the metal connections for etching. Upon etching, the metal connections form one or more metal stringers 310-1, 310-2, . . . , 310-n between the bulk electron portion 120 and the adjacent portion 125. The one or more metal stringers 310-1, 310-2, . . . , 310-n may be collectively referred to as metal stringer(s) 310. Further, in certain cases, the metal connections may be etched such that a metal stringer 310 may be formed in a spacing between two consecutive metal connections. It will be appreciated that during etching some or all of the metal connections may form a corresponding metal stringer 310. Each of the metal stringers 310 thus formed may have a thickness, for example, in the range of 0.2 micron to 1 micron. The metal stringers 310 may provide for leakage of electrons from the bulk electron portion 120 to the adjacent portion 125 in a predetermined time period, as discussed above.

Although implementations for integrated circuits have been described in language specific to structural features and/or methods, it would be understood that the appended claims are not necessarily limited to the specific features or methods described. Rather, the specific features and methods are disclosed as example implementations for integrated circuits.

We claim:

1. An integrated circuit comprising:
   a first metal layer;
   a dielectric layer; and
   a second metal layer capacitively coupled to the first metal layer through the dielectric layer, the second metal layer including a bulk electron portion, an intermediate portion, and an adjacent portion, the bulk electron portion and the adjacent portion being laterally separated by the intermediate portion,
   wherein the intermediate portion includes an electron leakage path to provide leakage of charge from the bulk electron portion to the adjacent portion in a predetermined leak time period.

2. The integrated circuit as claimed in claim 1, wherein the electron leakage path has a cross-sectional area, wherein the cross-sectional area of the electron leakage path determines the predetermined leak time period, and wherein the cross-sectional area of the electron leakage path is selected during fabrication of the integrated circuit to provide the predetermined leak time period, and the bulk electron portion and the adjacent portion are laterally planar with respect to one another and are within the second metal layer that is planar.

3. The integrated circuit as claimed in claim 1, wherein the intermediate portion extends from the second metal layer to one of the first metal layer and the dielectric layer.

4. The integrated circuit as claimed in claim 1, wherein the electron leakage path comprises at least one metal stringer connecting the bulk electron portion to the adjacent portion, the at least one metal stringer extends through the intermediate portion.

5. The integrated circuit as claimed in claim 1, wherein the integrated circuit is an electrically programmable read only memory (EPROM) chip further including:
   a polygate layer coupled to the second metal layer, the second metal layer being disposed parallel to a plane of the polygate layer, and the polygate layer and the second metal layer forming a floating gate; and
   a metal stringer coupled to the bulk electron portion and the adjacent portion, and to provide leakage of charge from the polygate layer to the bulk electron portion and from the bulk electron portion to the adjacent portion in the predetermined leak time period.

6. The integrated circuit as claimed in claim 1, wherein the integrated circuit may include a plurality of bits, and where the electron leakage path is provided for each of the plurality of bits, and wherein each of a plurality of electron leakage paths provides for leakage of charge in a corresponding predetermined leak time period.

7. The integrated circuit as claimed in claim 1, wherein the bulk electron portion is separated from the adjacent portion by a predetermined distance.

8. The integrated circuit as claimed in claim 7, wherein, upon charging of the bulk electron portion, stored electrons are stored in the bulk electron portion, and wherein the stored electrons from the bulk electron portion leak to the adjacent portion through the electron leakage path.

9. The integrated circuit as claimed in claim 1, wherein the predetermined leak time period is at least one second.

10. The integrated circuit of claim 1, further including a metal connect in the intermediate portion, the metal connect to couple the bulk electron portion to the adjacent portion and to provide leakage of electrons from the bulk electron portion to the adjacent portion.

11. The integrated circuit of claim 1, further including
a polygate layer connected to the second metal layer, the second metal layer being is disposed atop of the polygate layer, the polygate layer and the second metal layer forming a floating gate, and the first metal layer forming a control gate; and
a semiconductor substrate layer having a source junction and a drain junction,
wherein a ratio of a capacitance between the control gate and the floating gate to capacitance of the floating gate and the semiconductor substrate layer is positive.

12. An integrated circuit comprising:
a first metal layer; and
a second metal layer capacitively coupled to the first metal layer, the second metal layer comprising a bulk electron portion, an intermediate portion, and an adjacent portion, laterally separated from the bulk electron portion by the intermediate portion, wherein the bulk electron portion is coupled to the adjacent portion through at least one metal stringer in the intermediate portion, and wherein the at least one metal stringer is to provide leakage of charge from the bulk electron portion to the adjacent portion in a predetermined leak time period.

13. The integrated circuit as claimed in claim 12, wherein the second metal layer is disposed atop and connected to a polygate layer, and wherein the polygate layer and the second metal layer form a floating gate.

14. The integrated circuit as claimed in claim 13, wherein the at least one metal stringer provides for leakage of charge from the polygate layer to the bulk electron portion and from the bulk electron portion to the adjacent portion in a predetermined leak time period.

15. The integrated circuit as claimed in claim 12, wherein the integrated circuit includes a dielectric layer to couple the first metal layer to the second metal layer, and the first metal layer is not directly connected to the second metal layer.

16. The integrated circuit as claimed in claim 12, wherein a cross-section of the at least one metal stringer defines a rate of leakage of charge from the bulk electron portion to the adjacent portion.

17. The integrated circuit as claimed in claim 12, wherein the integrated circuit is a non-volatile memory chip.

18. The integrated circuit as claimed in claim 12, wherein the intermediate portion extends from the second metal layer to one of a dielectric layer and the first metal layer.

19. The integrated circuit as claimed in claim 12, wherein the bulk electron portion is separated from the adjacent portion by a predetermined distance, wherein, upon charging of the bulk electron portion, stored electrons are stored in the bulk electron portion, and wherein the stored electrons from the bulk electron portion leak to the adjacent portion through an electron leakage path provided by the at least one metal stringer.

20. The integrated circuit as claimed in claim 12, wherein the predetermined leak time period is at least one second.

* * * * *